(12) United States Patent
Wu et al.

(10) Patent No.: US 10,466,369 B2
(45) Date of Patent: Nov. 5, 2019

(54) ENERGY-RESOLVED X-RAY IMAGE DETECTOR

(71) Applicant: Institute of Nuclear Energy Research, Atomic Energy Council, Executive Yuan, R.O.C, Taoyuan (TW)

(72) Inventors: Hsiang-Ning Wu, Taoyuan (TW); Hsin-Chin Liang, Taoyuan (TW)

(73) Assignee: INSTITUTE OF NUCLEAR ENERGY RESEARCH, ATOMIC ENERGY COUNCIL, EXECUTIVE YUAN, R.O.C, Taoyuan (TW)

( * ) Notice: Subject to any disclaimer, the term of this patent is extended or adjusted under 35 U.S.C. 154(b) by 0 days.

(21) Appl. No.: 16/167,695

(22) Filed: Oct. 23, 2018

(65) Prior Publication Data

US 2019/0120976 A1    Apr. 25, 2019

(30) Foreign Application Priority Data

Oct. 24, 2017  (TW) .............................. 106136556 A

(51) Int. Cl.
   *G01T 1/202*   (2006.01)
   *G01T 1/20*    (2006.01)
   *H01L 27/146*  (2006.01)

(52) U.S. Cl.
   CPC ............ *G01T 1/202* (2013.01); *G01T 1/2008* (2013.01); *G01T 1/2018* (2013.01); *H01L 27/14658* (2013.01); *G01T 1/2002* (2013.01); *G01T 1/2006* (2013.01)

(58) Field of Classification Search
   CPC ..... G01T 1/2018; G01T 1/202; G01T 1/2971; G01T 1/2008; G01T 1/2002; G01T 1/1642; G01T 1/201; G01T 1/243; G01T 5/08
   See application file for complete search history.

(56) References Cited

U.S. PATENT DOCUMENTS

| 5,391,878 A * | 2/1995 | Petroff ...................... G01T 1/20 250/366 |
| 5,453,623 A * | 9/1995 | Wong .................... G01T 1/1642 250/363.03 |
| 2010/0270462 A1* | 10/2010 | Nelson .................. G01T 1/2018 250/252.1 |

* cited by examiner

*Primary Examiner* — David P Porta
*Assistant Examiner* — Fani Boosalis
(74) *Attorney, Agent, or Firm* — Locke Lord LLP; Tim Tingkang Xia, Esq.

(57) ABSTRACT

An energy-resolved X-ray image detector includes a scintillation crystal layer, a photon detector layer and an optical layer. The scintillation crystal layer includes a plurality of scintillation crystals. The photon detector layer includes a plurality of photon detector elements. The optical layer is disposed between the scintillation crystal layer and the photon detector layer. The optical layer includes a plurality of optical elements having different light transmittances. The scintillation crystal is used for converting the X-ray beams into scintillation lights, and, when each scintillation light injects the corresponding optical elements, the light transmittances of the optical elements determine whether the scintillation lights can pass through the respective optical elements. The photon detection element then detects the scintillation lights passing through the corresponding optical elements to discriminate the energy of the X-ray beams.

9 Claims, 3 Drawing Sheets

ENERGY-RESOLVED X-RAY IMAGE DETECTOR

CROSS REFERENCE TO RELATED APPLICATION

This application claims the benefit of Taiwan Patent Application Serial No. 106136556, filed on Oct. 24, 2017, the subject matter of which is incorporated herein by reference.

BACKGROUND OF THE INVENTION (1) Field of the Invention

The invention relates to an image-detecting device, and more particularly to an energy-resolved X-ray image detector.

(2) Description of the Prior Art

X-ray imaging is usually seen in medical imaging, airport security inspection, industrial non-destructive testing and so on. Conventionally, an X-ray detecting device is used to detect an object able to reflect different X-rays intensities. However, in the X-ray detecting, only information of geometrical structuring of the object to be tested can be revealed, but material information of the object to be tested is yet to be realized. In the art, an apparatus able to discriminate energies of the X-ray beams has been developed recently. By this apparatus, the material information of the object to be tested can be understood by realizing different absorption characteristics of individual materials upon some X-ray beams with specific energies.

Currently, in the art of discriminating energies of X-ray beams, photon counting and stratified crystal techniques are mainly applied. In the photon counting technique, each X-ray beam is transformed into a corresponding electrical pulse signal by a detector, in which the magnitude of the electrical pulse signal is correlated to the energy of the X-ray beam. A comparator assigned with a threshold value is further applied at an electronic end to discriminate the magnitude of the electrical pulse signal. Though the threshold value can be relevantly adjusted to reach a required energy section, yet some more electric circuit components shall be added. However, such an addition of the electronic circuit components would increase structural complexity and manufacturing difficulty of the resulted circuit, and the cost as well. On the other hand, the stratified crystal technique adopts a multilayer scintillation crystal structure, which is obtained by laminating a plurality of scintillation crystals with different depths. By the dependency between the X-ray energy and the work depth of scintillation crystal, the X-ray beam with a weaker energy would react with the scintillation crystals in the superficial layers, while that with a stronger energy reacts with the scintillation crystals in the deeper layers. Positively, by utilizing the aforesaid physical properties to design crystal layers with individual thicknesses according to specific energy sections, lots of shortcomings in the conventional imaging techniques can be overcome. However, since more optoelectronic components shall be included, thus manufacturing thereof would be much more complicated, and the corresponding production cost would be higher.

SUMMARY OF THE INVENTION

Accordingly, it is an object of the present invention to provide an energy-resolved X-ray image detector, that can discriminate energy sections of an X-ray image without a cost hike.

In the present invention, the energy-resolved X-ray image detector includes a scintillation crystal layer, a photon detector layer and an optical layer. The scintillation crystal layer includes a plurality of scintillation crystals. A plurality of X-ray beams injects the plurality of scintillation crystals, and the scintillation crystals transform the plurality of X-ray beams into corresponding scintillation lights fallen in different energy sections. The photon detector layer includes a plurality of photon detector elements. The optical layer, disposed between the scintillation crystal layer and the photon detector layer, includes a plurality of optical elements having respective light transmittance. When the scintillation lights inject the respective optical elements, the light transmittance of the optical elements determine whether or not the scintillation lights pass through the optical elements individually. The photon detector elements are to detect the scintillation lights passing through the respective optical elements so as to discriminate an energy of the X-ray beams.

In one embodiment of the present invention, each of the optical elements with different transmittance are arranged into a correspondent subarray. A plurality of the aforesaid subarrays are arranged in an array manner to form the optical layer.

In one embodiment of the present invention, a photon count of the scintillation lights is positively related to the energy of the X-ray beams.

In one embodiment of the present invention, the scintillation crystals are arranged in an array manner to form the scintillation crystal layer.

In one embodiment of the present invention, the optical elements are arranged in an array manner to form the optical layer.

In one embodiment of the present invention, the photon detector elements are arranged in an array manner to form the photon detector layer.

In one embodiment of the present invention, each of the scintillation crystals includes a solid-state scintillation material.

In one embodiment of the present invention, the light output face of each optical element is covered by the respective photon detector element.

In one embodiment of the present invention, the light output face of each scintillation crystal is covered by the respective optical element.

As described above, the energy-resolved X-ray image detector provided by the present invention introduces different scintillation lights generated from different energy sections of the X-ray beams to enter individual optical elements having respective light transmittance, then applies individual photon detector elements to detect the scintillation lights passing through the corresponding optical elements. Thereupon, X-ray counts for individual energy sections of the X-ray beams can be obtained by calculated signals of the photon detector elements, so that the energy of the X-ray beams can be discriminated clearly enough to obtain energy information of the X-ray beams for performing the X-ray imaging.

All these objects are achieved by the energy-resolved X-ray image detector described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to an energy-resolved X-ray image detector. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
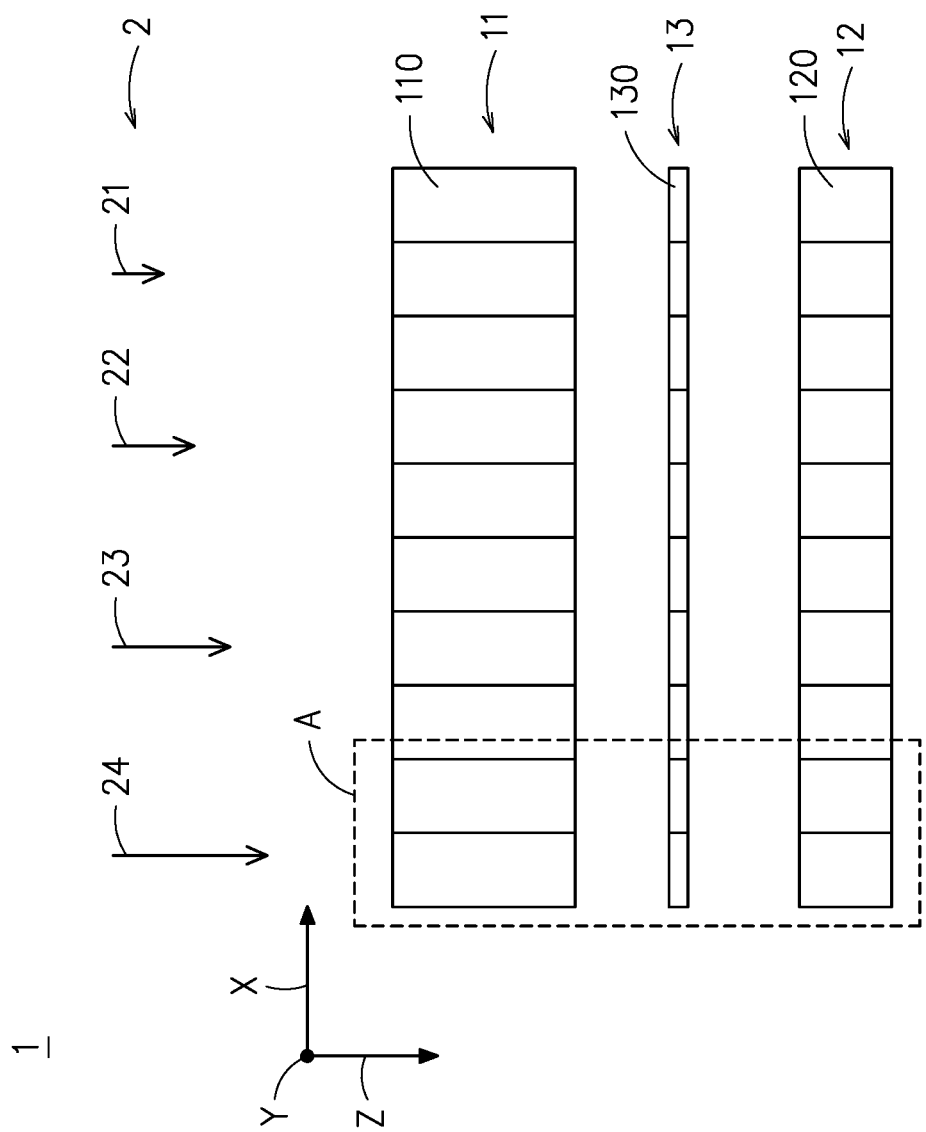
FIG. 1 is a schematic view of an embodiment of the energy-resolved X-ray image detector in accordance with the present invention.
Figure 2:
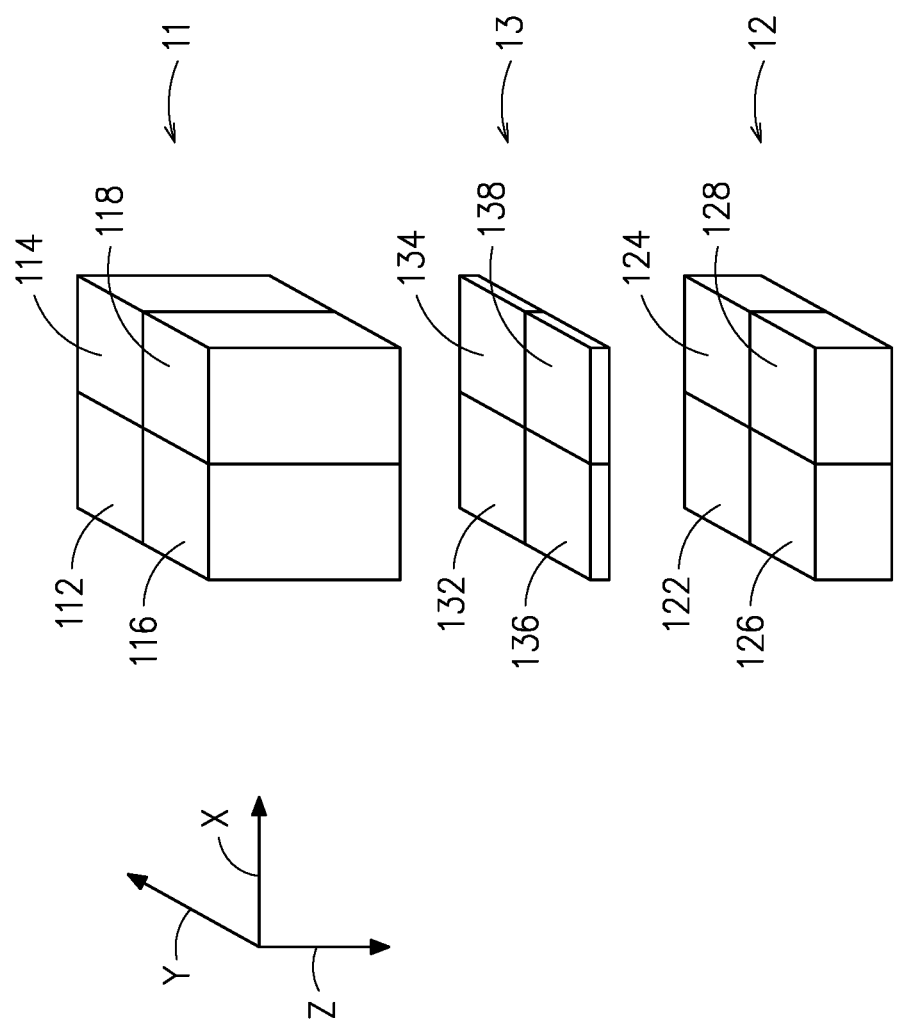
FIG. 2 is a schematic view of area A of FIG. 1.
Figure 3:
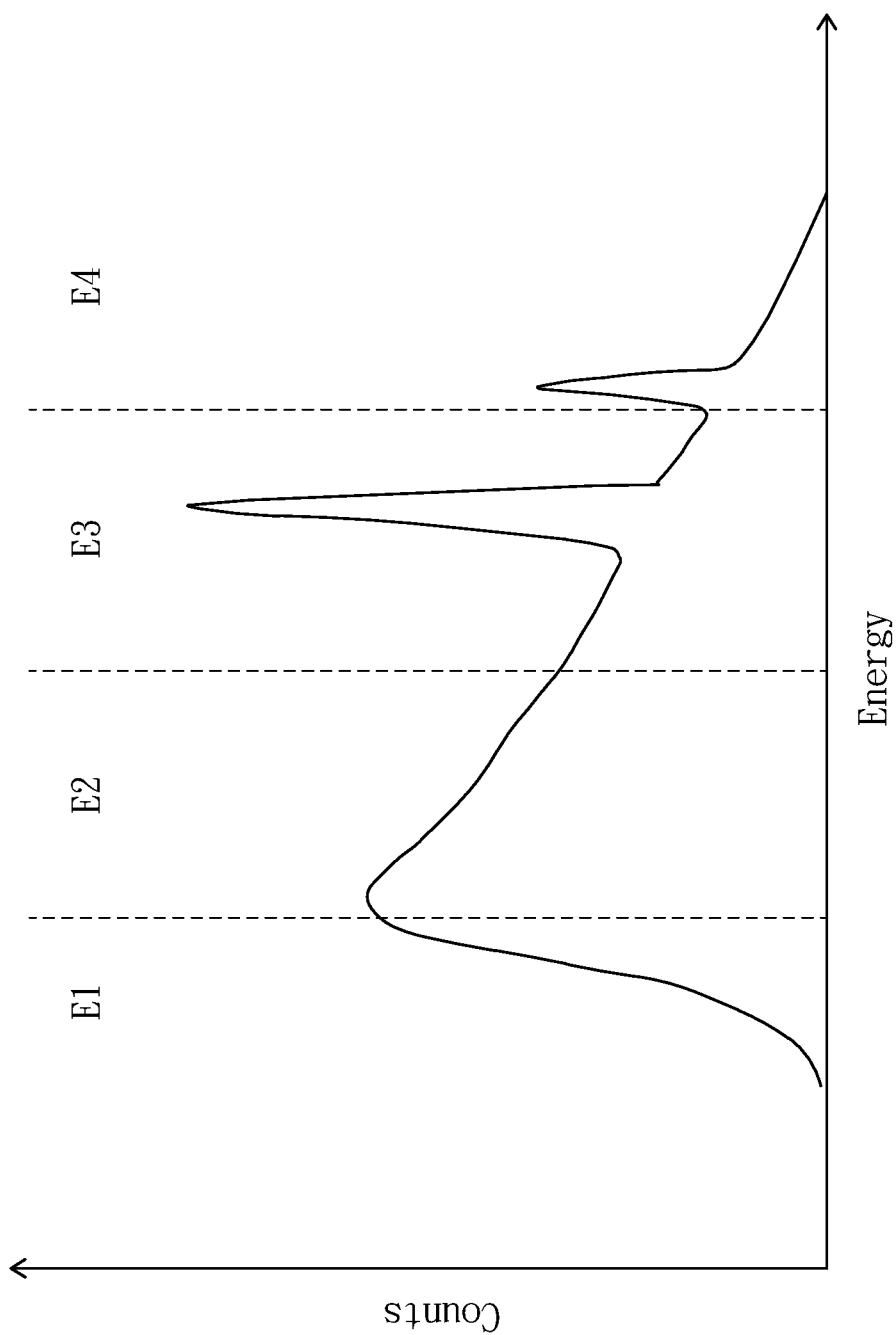
FIG. 3 is a schematic view of an exemplary example of photon counts with respect to energies in accordance with the present invention.

Refer to FIG. 1 through FIG. 3; where FIG. 1 is a schematic view of an embodiment of the energy-resolved X-ray image detector in accordance with the present invention, FIG. 2 is a schematic view of area A of FIG. 1, and FIG. 3 is a schematic view of an exemplary example of photon counts with respect to energies in accordance with the present invention. In FIG. 3, the horizontal axis stands for the energy of X-ray beam, while the vertical axis stands for the count of X-ray beams (i.e., the photon count). As shown in FIG. 1, the energy-resolved X-ray image detector 1 of this embodiment includes a scintillation crystal layer 11, a photon detector layer 12 and an optical layer 13. The scintillation crystal layer 11 includes a plurality of scintillation crystals 110, and each of the scintillation crystals 110 is made of a solid-state scintillation material. In the present invention, all these scintillation crystals 110 can be the same scintillation crystals (i.e., all made of the same material). The scintillation crystal 110 is used to transform each of the X-ray beams 2 into a corresponding scintillation light. By having FIG. 1 as an example, in a first direction Z, the scintillation crystal layer 11 is formed as a single layer structure lying on a plane expanded by a second direction X and a third direction Y. The scintillation crystals 110 are arranged into the scintillation crystal layer 11 in, but not limited to, an array manner. In some other embodiments, the scintillation crystals 110 can be formed into a honeycomb manner. Namely, according to the present invention, these scintillation crystals 110 can be arranged into the scintillation crystal layer 11 in an orderly manner. In this disclosure, the first direction Z, the second direction X and the third direction Y are perpendicular to each other; i.e., forming an orthogonal coordinate system.

In this embodiment, in the first direction Z, the photon detector layer 12 and the scintillation crystal layer 11 are arranged to opposing sides of the energy-resolved X-ray image detector 1. The photon detector layer 12 includes a plurality of photon detector elements 120, and each of the photon detector elements 120 can be a photodiode served as an optical-to-electrical (o/e) converter for transforming a received optical signal into a corresponding electrical signal. As shown in FIG. 1, in the first direction Z, the photon detector layer 12 is a single layer structure lying on a plane expanded by the second direction X and the third direction Y. These photon detector elements 120 are arranged to form the photon detector layer 12 in an array manner. In the first direction Z, the optical layer 13 is disposed between the scintillation crystal layer 11 and the photon detector layer 12. In the present invention, the optical layer 13 can be produced by printing, coating or painting. The optical layer 13 includes a plurality of optical elements 130. As shown in FIG. 1, in the first direction Z, the optical layer 13 is a single layer structure lying on a plane expanded by the second direction X and the third direction Y, and these optical elements 130 are arranged to form a optical layer 13 in an array manner. In this embodiment, these optical elements 130 may have individual transmittances; for example, four different transmittances for the optical elements 130 in the optical layer 13. The optical elements 130 contain materials able to absorb, reflect or scatter the scintillator light. In addition, the transmittance of the optical element 130 can be tuned by including different concentrations of the material, types of the material and/or thicknesses of the optical elements 130.

Referring now to FIG. 2, on the plane expanded by the second direction X and the third direction Y, the scintillation crystal layer 11 includes first scintillation crystals 112, second scintillation crystals 114, third scintillation crystals 116 and fourth scintillation crystals 118. In particular, one said first scintillation crystal 112, one said second scintillation crystal 114, one said third scintillation crystal 116 and one said fourth scintillation crystal 118 are integrated to form a 2×2 subarray. On the plane expanded by the second direction X and the third direction Y, the optical layer 13 includes first optical elements 132, second optical elements 134, third optical elements 136 and fourth optical elements 138. In particular, one said first optical element 132, one said second optical element 134, one said third optical element 136 and one said fourth optical element 138 are integrated to form another 2×2 subarray. The subarray is arranged in an array manner to form the optical layer 13. In this embodiment, the first optical elements 132 may provide the highest transmittance, the second optical element 134 may provide the second high transmittance, the third optical element 136 may provide the third high transmittance, and the fourth optical element 138 may provide the lowest transmittance among these three optical elements 132, 134, 136, 138. In addition, in the first direction Z, the first optical element 132 is disposed respective to the first scintillation crystal 112, the second optical element 134 is disposed respective to the second scintillation crystal 114, the third optical element 136 is disposed respective to the third scintillation crystal 116, and the fourth optical element 138 is disposed respective to the fourth scintillation crystal 118. In addition, the light output face of each scintillation crystal is covered by the respective optical element 130.

In this embodiment, on the plane expanded by the second direction X and the third direction Y, the photon detector layer 12 includes the first photon detector elements 122, the second photon detector elements 124, the third photon detector elements 126 and the fourth photon detector elements 128, in which the neighboring first photon detector element 122, second photon detector element 124, third photon detector element 126 and fourth photon detector element 128 are integrated to form a 2×2 subarray. Also, in the first direction Z, the first photon detector element 122 is disposed respective to the first optical element 132, the second photon detector elements 124 is disposed respective to the second optical element 134, the third photon detector element 126 is disposed respective to the third optical element 136, and the fourth photon detector element 128 is disposed respective to the fourth optical element 138. In addition, the light output face of each optical element 130 is covered by the respective photon detector element 120.

In this embodiment, as shown in FIG. 1, the X-ray beams 2 with different energies can be sent into and thus react with the scintillation crystal layer 11, so that scintillation lights with different photon counts would be generated. In the scintillation light, the photon count of the X-ray beam is positively related to the energy thereof. Namely, the larger the energy of the X-ray beam is, the more the photon count of the corresponding scintillation light has. Contrarily, if the X-ray beam has less energy, then the photon count of the corresponding scintillation light would be smaller. In addition, when photons enter the optical layer 13, a portion of the photons would be blocked, such that the scintillation light respective to any X-ray beam 2 having an energy less than a specific value would be completely blocked by the optical layer 13. Also, the scintillation light respective to any X-ray beam 2 having an energy more than a specific value would be partly blocked by the optical layer 13, and partly leave, by penetrating through, the optical layer 13 to be detected by the photon detector layer 12.

In this embodiment, the X-ray beams 2 include a first X-ray beam 21, a second X-ray beam 22, a third X-ray beam 23 and a fourth X-ray beam 24, in which the energy of the first X-ray beam 21 is respective to the first energy section E1 of FIG. 3, the energy of the second X-ray beam 22 is respective to the second energy section E2 of FIG. 3, the energy of the third X-ray beam 23 is respective to the third energy section E3 of FIG. 3, and the energy of the fourth X-ray beam 24 is respective to the fourth energy section E4 of FIG. 3. Under such an arrangement, since the first optical element 132, the second optical element 134, the third optical element 136 and the fourth optical element 138 have different light transmittances, thus, when the X-ray beams 2 inject the first scintillation crystal 112 to produce corresponding scintillation lights to further hit the first optical element 132 having the highest transmittance, it implies that the first X-ray beam 21, the second X-ray beam 22, the third X-ray beam 23 and the fourth X-ray beam 24 of the X-ray beams 2 corresponding to the first energy section E1, the second energy section E2, the third energy section E3 and the fourth energy section E4 would induce most of respective scintillation lights to penetrate the first optical element 132. Then, the first photon detector element 122 would detect the penetrating scintillation lights and produce corresponding count of the first X-ray signal, in which the count of first X-ray signal includes photons fallen in the first energy section E1, the second energy section E2, the third energy section E3 and the fourth energy section E4. When the X-ray beams 2 inject the second scintillation crystal 114 to produce corresponding scintillation lights to enter the second optical element 134, since the second optical element 134 has the second high transmittance, thus the scintillation light corresponding to the first energy section E1 of the first X-ray beam 21 would be blocked by the second optical element 134. However, the scintillation lights of the second X-ray beam 22, the third X-ray beam 23 and the fourth X-ray beam 24 in correspondence with the second energy section E2, the third energy section E3 and the fourth energy section E4 would penetrate the second optical element 134 and further be detected by the second photon detector element 124 for generating a corresponding count of the second X-ray signal. The count of the second X-ray signal includes photons fallen in the second energy section E2, the third energy section E3 and the fourth energy section E4. When the X-ray beams 2 inject the third scintillation crystal 116 to produce corresponding scintillation lights to enter the third optical element 136, since the third optical element 136 has a transmittance less than the second optical element 134 does, thus the scintillation lights corresponding to the first energy section E1 of the first X-ray beam 21 and the second energy section E2 of the second X-ray beam 22 would be blocked by the third optical element 136. However, the scintillation lights of the third X-ray beam 23 and the fourth X-ray beam 24 in correspondence with the third energy section E3 and the fourth energy section E4 would penetrate the third optical element 136 and further be detected by the third photon detector element 126 for generating a corresponding count of the third X-ray signal. The count of the third X-ray signal includes photons fallen in the third energy section E3 and the fourth energy section E4. When the X-ray beams 2 inject the fourth scintillation crystal 118 to produce corresponding scintillation lights to enter the fourth optical element 138, since the fourth optical element 138 has a light transmittance less than the third optical element 136 does, thus the scintillation lights corresponding to the first energy section E1 of the first X-ray beam 21, the second energy section E2 of the second X-ray beam 22 and the third energy section E3 of the third X-ray beam 23 would be blocked by the fourth optical element 138. However, the scintillation lights of the fourth X-ray beam 24 in correspondence with the fourth energy section E4 would penetrate the fourth optical element 138 and further be detected by the fourth photon detector element 128 for generating a corresponding count of the fourth X-ray signal. The count of the fourth X-ray signal includes only photons fallen in the fourth energy section E4. Thereupon, from the count of the fourth X-ray signal and the count of the third X-ray signal, the count of photons fallen in the third energy section E3 can be calculated. Similarly, after the count of photons fallen in the third energy section E3 is obtained, then from the counts of the fourth X-ray signal, the third X-ray signal and the second X-ray signal, the count of photons fallen in the second energy section E2 can be calculated. Finally, through the counts of the first X-ray signal, the second X-ray signal, the third X-ray signal and the fourth X-ray signal, the count of photons fallen in the first energy section E1 can be obtained. Hence, all individual photon counts in the first energy section E1, the second energy section E2, the third energy section E3 and the fourth energy section E4 can be obtained, and thus individual energies of the first X-ray beam 21, the second X-ray beam 22, the third X-ray beam 23 and the fourth X-ray beam 24 in the X-ray beams can be realized. Namely, the energy information of the X-ray beams can be clearly discriminated, so that a corresponding X-ray image can be easily obtained.

In summary, the energy-resolved X-ray image detector provided by the present invention introduces different scintillation lights generated from different energy sections of the X-ray beams to enter individual optical elements having respective light transmittances, then applies individual photon detector elements to detect the scintillation lights passing through the corresponding optical elements. Thereupon, X-ray counts for individual energy sections of the X-ray beams can be obtained by calculated signals of the photon detector elements, so that the energy of the X-ray beams can be discriminated clearly enough to obtain energy information of the X-ray beams for performing the X-ray imaging.

Further, in comparison with the prior art, no expensive electronic circuit system is required, the present invention produces the multilayer scintillation crystals with specific thicknesses by cutting or adopts the scintillation crystals made of different materials to discriminate the energy of the X-ray beams. Thus, the production cost of the optical layer for discriminating the energy can be reduced by printing, coating or painting.

In addition, since the present invention does not rely on the electronic circuit system to discriminate the energy, thus neither additional circuit components nor production of precision electronic circuit is required. Thereupon, the production cost, complexity and difficulty of the device of the present can be substantially reduced.

Further, since the present invention does not use the scintillation crystals to discriminate the energy directly, thus plenty materials for producing the scintillation crystals and the necessity of multilayer scintillation crystals are no more needed. Thereupon, again, the production cost, complexity and difficulty of the device of the present can be substantially reduced.

Furthermore, since the present invention does not adopt the electronic circuit system, multilayer scintillation crystals with specific thicknesses by cutting, or scintillation crystals made of different materials to discriminate the energy of the X-ray beams, but applies simply the singe-layer scintillation crystals, thus no additional design upon the electronic circuit is required. Thus, the entire thickness and weight of the energy-resolved X-ray image detector can be reduced. Hence, the device provided by the present invention featured in light weight and tiny volume can provide superior portability, and thus can be applied to the portable detecting or inspecting apparatus While the present invention has been particularly shown and described with reference to a preferred embodiment, it will be understood by those skilled in the art that various changes in form and detail may be without departing from the spirit and scope of the present invention.

What is claimed is:

1. An energy-resolved X-ray image detector, comprising:
    a scintillation crystal layer, including a plurality of scintillation crystals, wherein a plurality of X-ray beams injects the plurality of scintillation crystals, and the scintillation crystals transform the plurality of X-ray beams into corresponding scintillation lights fallen in different energy sections;
    a photon detector layer, including a plurality of photon detector elements; and
    an optical layer, disposed between the scintillation crystal layer and the photon detector layer, including a plurality of optical elements having respective light transmittances; wherein, when the scintillation lights inject the respective optical elements, the light transmittances of the optical elements determine whether or not the scintillation lights pass through the optical elements individually; wherein, the photon detector elements are to detect the scintillation lights passing through the respective optical elements so as to discriminate an energy of the X-ray beams.

2. The energy-resolved X-ray image detector of claim 1, wherein the optical elements with different transmittances are arranged in a subarray, the subarray being arranged in an array manner to form the optical layer.

3. The energy-resolved X-ray image detector of claim 1, wherein a photon count of the scintillation lights is positively related to the energy of the X-ray beams.

4. The energy-resolved X-ray image detector of claim 1, wherein the scintillation crystals are arranged in an array manner to form the scintillation crystal layer.

5. The energy-resolved X-ray image detector of claim 1, wherein the optical elements are arranged in an array manner to form the optical layer.

6. The energy-resolved X-ray image detector of claim 1, wherein the photon detector elements are arranged in an array manner to form the photon detector layer.

7. The energy-resolved X-ray image detector of claim 1, wherein each of the scintillation crystals includes a solid-state scintillation material.

8. The energy-resolved X-ray image detector of claim 1, wherein a light output face of each said optical element is covered by the respective photon detector element.

9. The energy-resolved X-ray image detector of claim 1, wherein a light output face of each said scintillation crystal is covered by the respective optical element.

* * * * *